（12) United States Patent
Shioyama

(10) Patent No.: US 11,373,958 B2
(45) Date of Patent: Jun. 28, 2022

(54) SEMICONDUCTOR DEVICE AND SEMICONDUCTOR DEVICE MANUFACTURING METHOD FOR PREVENTION OF METALLIC DIFFUSION INTO A SEMICONDUCTOR SUBSTRATE

(71) Applicant: SONY CORPORATION, Tokyo (JP)

(72) Inventor: Tadamasa Shioyama, Kumamoto (JP)

(73) Assignee: SONY CORPORATION, Tokyo (JP)

(*) Notice: Subject to any disclaimer, the term of this patent is extended or adjusted under 35 U.S.C. 154(b) by 45 days.

(21) Appl. No.: 16/308,723

(22) PCT Filed: May 8, 2017

(86) PCT No.: PCT/JP2017/017330
§ 371 (c)(1),
(2) Date: Dec. 10, 2018

(87) PCT Pub. No.: WO2018/003288
PCT Pub. Date: Jan. 4, 2018

(65) Prior Publication Data
US 2019/0148309 A1    May 16, 2019

(30) Foreign Application Priority Data
Jun. 28, 2016 (JP) .............................. JP2016-127750

(51) Int. Cl.
*H01L 23/544* (2006.01)
*H01L 23/522* (2006.01)
(Continued)

(52) U.S. Cl.
CPC ........ *H01L 23/544* (2013.01); *H01L 21/3205* (2013.01); *H01L 21/768* (2013.01);
(Continued)

(58) Field of Classification Search
CPC . H01L 23/544; H01L 23/481; H01L 21/3205; H01L 21/768; H01L 21/76801;
(Continued)

(56) References Cited

U.S. PATENT DOCUMENTS
2007/0069364 A1  3/2007  Kawano et al.
2012/0256300 A1  10/2012  Nakamura
(Continued)

FOREIGN PATENT DOCUMENTS
JP    2007-123857 A    5/2007
JP    2011-176003 A    9/2011
(Continued)

OTHER PUBLICATIONS

International Search Report and Written Opinion of PCT Application No. PCT/JP2017/017330, dated Jun. 27, 2017, 10 pages of ISRWO.

*Primary Examiner* — Thao X Le
*Assistant Examiner* — Laura M Dykes
(74) *Attorney, Agent, or Firm* — Chip Law Group

(57) ABSTRACT

Provided is a semiconductor device that includes a semiconductor substrate, an interconnection layer that is formed on a first face of the semiconductor substrate, at least one of a structural element that is formed to the interconnection layer, or a structural element that is formed in the semiconductor substrate from the first face side of the semiconductor substrate, a semiconductor-through-electrode that is positioned and formed, from a second face side of the semiconductor substrate opposite to the first face, so as to have a predetermined positional relationship with respect to the structural element, and a metallic-diffusion-preventing insulating layer that is formed from the first face side of the
(Continued)

semiconductor substrate in a position, and with a shape, surrounding the semiconductor-through-electrode in the semiconductor substrate.

6 Claims, 9 Drawing Sheets

(51) Int. Cl.
 *H01L 21/3205* (2006.01)
 *H01L 21/768* (2006.01)
 *H01L 23/48* (2006.01)

(52) U.S. Cl.
 CPC .. *H01L 21/76801* (2013.01); *H01L 21/76898* (2013.01); *H01L 23/481* (2013.01); *H01L 23/522* (2013.01); *H01L 2223/54426* (2013.01)

(58) Field of Classification Search
 CPC ............. H01L 21/76898; H01L 23/522; H01L 2223/54426
 USPC ......................................................... 257/621
 See application file for complete search history.

(56) References Cited

U.S. PATENT DOCUMENTS

| | | | |
|---|---|---|---|
| 2012/0292784 A1 | 11/2012 | Nishio | |
| 2013/0264720 A1* | 10/2013 | Chun | ................... H01L 23/481 257/774 |
| 2014/0179103 A1* | 6/2014 | Kang | ................. H01L 21/7684 438/667 |
| 2015/0380385 A1* | 12/2015 | Hsu | ........................ H01L 24/03 257/774 |

FOREIGN PATENT DOCUMENTS

| | | |
|---|---|---|
| JP | 2012-222141 A | 11/2012 |
| JP | 2014-146426 A | 8/2014 |
| WO | 2011/104777 A1 | 9/2011 |
| WO | 2014/002852 A1 | 1/2014 |

* cited by examiner

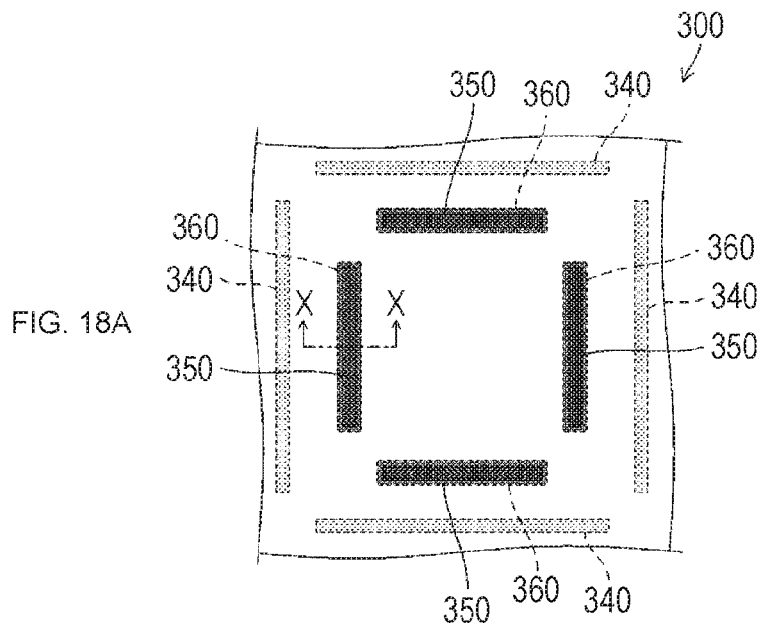
FIG. 18A
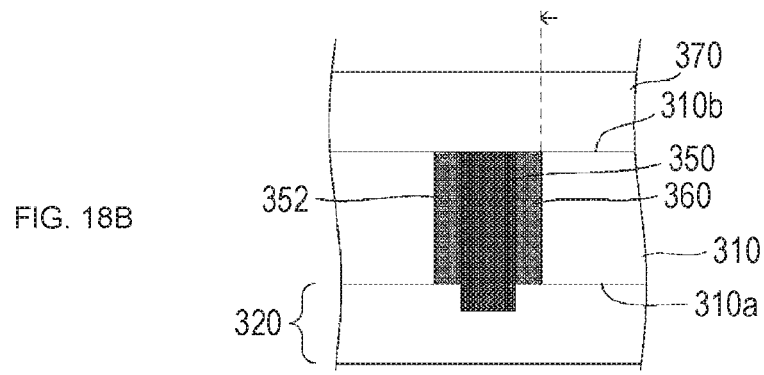
FIG. 18B
FIG. 19
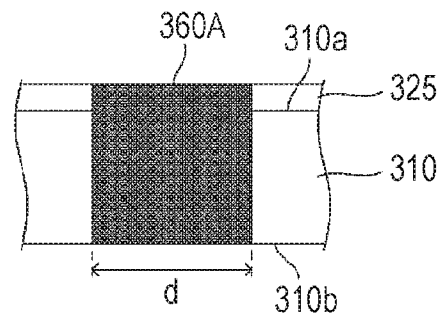

SEMICONDUCTOR DEVICE AND SEMICONDUCTOR DEVICE MANUFACTURING METHOD FOR PREVENTION OF METALLIC DIFFUSION INTO A SEMICONDUCTOR SUBSTRATE

CROSS REFERENCE TO RELATED APPLICATIONS

This application is a U.S. National Phase of International Patent Application No. PCT/JP2017/017330 filed on May 8, 2017, which claims priority benefit of Japanese Patent Application No. JP 2016-127750 filed in the Japan Patent Office on Jun. 28, 2016. Each of the above-referenced applications is hereby incorporated herein by reference in its entirety.

TECHNICAL FIELD

The present technology relates to a semiconductor device and a semiconductor device manufacturing method.

BACKGROUND ART

Conventionally, there are two main kinds of manufacturing methods for forming through-electrodes for a semiconductor substrate. In the first method, after processing a through-electrode part, an insulating film (for example, an oxide film or a nitride film) configured from material that has an insulating effect and a metallic-diffusion-preventing effect is formed on a side of the processed part, after which a conductive material (for example, copper) is filled into a hole encircled by the insulating film. In the second method, in a step prior to processing a through-electrode part, an insulating film configured from material that has an insulating effect and a metallic-diffusion-preventing effect is pre-formed on the semiconductor substrate in a position, and with a shape, encircling the through-electrode part, and a through-electrode part is formed by forming a through-hole in a region encircled by the insulating film and filling a conductive material (for example, copper) into the through-hole (for example, see Patent Document 1). Since there is no step of covering a side face of the through-electrode part with an insulating film in the second method, the second method is able to ensure the reliability of connections to an interconnection layer.

CITATION LIST

Patent Document

Patent Document 1: WO 2014/002852 A1

SUMMARY OF THE INVENTION

Problems to be Solved by the Invention

Aforementioned Patent Document 1 involves technology relating to forming a through-electrode part that actually functions as a circuit component of a semiconductor device, and does not involve technology related to a through-electrode part that serves as an alignment mark employed when accurately positioning an insulating film formed in a preceding step with a through-electrode part formed in a subsequent step.

In consideration of the above issue, an object of the present technology is to realize a semiconductor device able to prevent metallic diffusion into a semiconductor substrate from a through-electrode part that serves as an alignment mark employed in order to accurately position an insulating film formed in a preceding step with the through-electrode part, which is formed in a subsequent step, and a method of manufacturing the semiconductor device.

Solutions to Problems

One aspect of the present technology is a semiconductor device including: a semiconductor substrate; an interconnection layer that is formed on a first face of the semiconductor substrate; at least one of a structural element that is formed to the interconnection layer, or a structural element that is formed in the semiconductor substrate from the first face side of the semiconductor substrate; a semiconductor-through-electrode that is positioned and formed, from a second face side of the semiconductor substrate opposite to the first face, so as to have a predetermined positional relationship with respect to the structural element; and a metallic-diffusion-preventing insulating layer that is formed from the first face side of the semiconductor substrate in a position, and with a shape, surrounding the semiconductor-through-electrode in the semiconductor substrate.

Furthermore, another aspect of the present technology is a semiconductor device manufacturing method including: a step of lamination-forming an interconnection layer on one side face of a semiconductor substrate; a step of forming a structural element in the semiconductor substrate; a step of forming a metallic-diffusion-preventing insulating layer that passes between front and back sides of the semiconductor substrate, in a shape that encircles a fixed region of the semiconductor substrate not including the structural element; a step of forming a hard mask along another side face of the semiconductor substrate; a step of forming a resist having an opening inside the fixed region on the hard mask; a step of verifying, on the basis of an image captured from the resist side, whether or not the opening is formed with a predetermined positional relationship with respect to the structural element; a step of removing the resist, and re-forming, on the basis of the image, a resist provided with an opening with the predetermined positional relationship with respect to the structural element, in a case where it has been verified that the opening is not formed with the predetermined positional relationship with respect to the structural element; and a step of forming a semiconductor-through-electrode by, using the resist as an etching mask, forming a through-hole that passes through to the interconnection layer, and embedding metal in the through-hole.

Note that the above-described semiconductor device encompasses various forms, such as a form implemented in a state incorporated into another apparatus or a form implemented alongside another method. Furthermore, the above-described method of manufacturing a semiconductor device also encompasses various forms, such as a form implemented as part of another method, or a form implemented as an apparatus for manufacturing a semiconductor device provided with means corresponding to respective steps.

Effects of the Invention

The present technology enables the realization of a semiconductor device able to prevent metallic diffusion into a semiconductor substrate from a through-electrode part that serves as an alignment mark employed in order to accurately position an insulating film formed in a preceding step with the through-electrode part, which is formed in a subsequent step, and the realization of a method of manufacturing the semiconductor device. Note that the effects described in the present specification are only examples, and the effects are not limited thereto. Furthermore, there may be additional effects.

BRIEF DESCRIPTION OF DRAWINGS

FIGS. 18A and 18B are diagrams illustrating relevant parts of a semiconductor device according to a third exemplary embodiment.

FIG. 19 is a diagram for explaining a method of manufacturing the semiconductor device according to the third exemplary embodiment.

MODE FOR CARRYING OUT THE INVENTION

Next, the present technology will be described in the following sequence.

(A) First Exemplary Embodiment:
(B) Second Exemplary Embodiment:
(C) Third Exemplary Embodiment:

(A) First Exemplary Embodiment

Figure 1A:
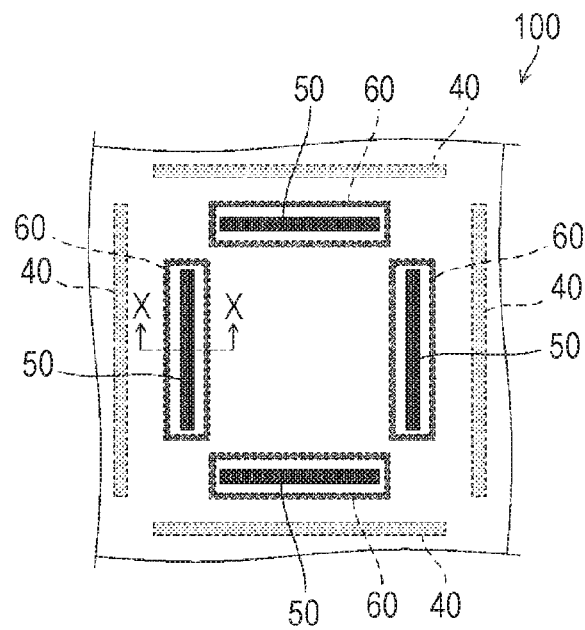
FIGS. 1A and 1B is a are diagrams illustrating relevant parts of a semiconductor device according to a first exemplary embodiment.
Figure 1B:
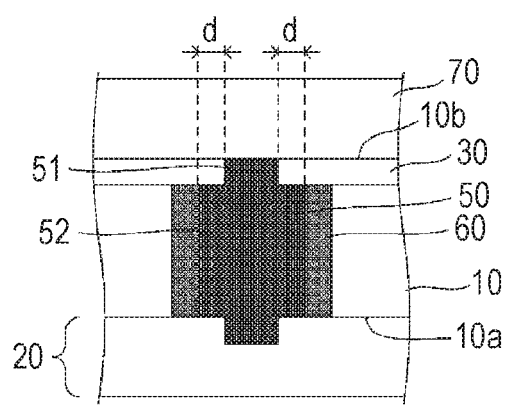

FIGS. 1A and 1B are diagrams illustrating relevant parts of a semiconductor device 100 according to the present exemplary embodiment. FIG. 1A is diagram illustrating relevant parts of the semiconductor device 100 as seen in plan view. FIG. 1B is a diagram illustrating relevant parts of the semiconductor device 100 as seen in a cross-sectional view along line X-X illustrated in FIG. 1A. Note that FIG. 1A is a diagram in which the semiconductor device 100 is seen from a back face 10b side of a semiconductor substrate 10, described later, in a state with no protective layer 70.

Note that although the relevant parts illustrated in FIGS. 1A and 1B are, for example, often provided at the edges of the semiconductor device 100 (for example, in the vicinity of scribe lines), the relevant parts are not necessarily limited thereto, and the relevant parts may be provided at other locations on the semiconductor device 100. Furthermore, although the various structural objects provided to the relevant parts are generally provided concentrated in a partial region on the semiconductor device 100 as illustrated in FIGS. 1A and 1B, implementations are also possible in which these various structural objects are provided while being dispersed over a plurality of regions on the semiconductor device 100.

The semiconductor device 100 is provided with the semiconductor substrate 10, an interconnection layer 20, a protective layer 30, structural elements 40, semiconductor-through-electrodes 50, insulating layers 60, and the protective layer 70.

A semiconductor substrate such as a silicon substrate, or a semiconductor substrate applicable to compound semiconductors or other general semiconductor devices, for example, may be employed as the semiconductor substrate 10.

The interconnection layer 20 is lamination-formed on a first face of the semiconductor substrate 10 (referred to as front face 10a hereafter), the first face being a face on one side of the semiconductor substrate 10. The interconnection layer 20 has a multi-layered interconnection layer configuration made up of a plurality of semiconductor layers that constitute interconnections, electrodes, and the like, and interlayer insulating layers that insulate the semiconductor layers from one another. Note that in the semiconductor device 100, a semiconductor device formed in a separate step may be moreover joined and bonded to the interconnection layer 20, and the semiconductor-through-electrodes 50 may have shapes that pass through the interconnection layer 20 and reach the semiconductor device joined and bonded thereto.

The protective layers 30, 70 are hard masks lamination-formed on a second face of the semiconductor substrate 10 (referred to as back face 10b hereafter), the second face being a face on another side of the semiconductor substrate 10. The protective layer 30 is provided covering the entire back face 10b of the semiconductor substrate 10 except for at positions where the semiconductor-through-electrodes 50 are provided. The protective layer 70 is provided covering the entire top of the protective layer 30 and portions of the semiconductor-through-electrodes 50 that are exposed from the protective layer 30. The protective layers 30, 70 are, for example, configured from an oxide film (SiO), a nitride film (SiN), or another insulating material.

The structural elements 40 are formed within the semiconductor substrate 10 and/or the interconnection layer 20. Examples of structural elements 40 formed to the interconnection layer 20 include, for example, conductors made of metal of the like that are surrounded by an insulator, or conversely, insulators surrounded by a conductor. Examples of structural elements 40 formed to the semiconductor substrate 10 include, for example, component-isolating units. Furthermore, in a case where a separate semiconductor substrate has been joined and bonded thereto, the structural elements 40 may be structural objects formed within the interconnection layer of the separate semiconductor substrate or within this semiconductor substrate. The structural elements 40 are formed using etching or another process performed from the front face 10a side of the semiconductor substrate 10.

The semiconductor-through-electrodes 50 are formed passing between the back face 10b and the front face 10a of the semiconductor substrate 10. Ordinarily, the semiconductor-through-electrodes 50 are formed electrically disconnected from functional parts that implement circuit functionality of the semiconductor device 100, and are formed as a configuration not involved in electrical signal processing of the semiconductor device 100 as an integrated circuit. Of course, semiconductor-through-electrodes configuring functional parts of the semiconductor device 100 may be utilized for the semiconductor-through-electrodes 50 according to the present exemplary embodiment.

The semiconductor-through-electrodes 50 are formed using etching or another process performed from the back face 10b side of the semiconductor substrate 10.

The semiconductor-through-electrodes 50 are formed passing through the protective layer 30 that is a hard mask. Of the semiconductor-through-electrodes 50, hard-mask-through-parts 51 that are locations passing through the protective layer 30 have a narrower width than semiconductor-through-bodies 52 formed in the semiconductor substrate 10. In other words, in profile, the semiconductor-through-electrodes 50 have a stepped shape at the boundary of the semiconductor substrate 10 and the protective layer 30.

The insulating layers 60 are formed within the semiconductor substrate 10. The insulating layers 60 are provided so as to be entirely interposed between the semiconductor-through-electrodes 50 and the semiconductor substrate 10. The insulating layers 60 are provided with a shape/structure surrounding the semiconductor-through-electrodes 50. The thickness of the insulating layers 60 is substantially constant. In other words, the semiconductor substrate 10 and the semiconductor-through-electrodes 50 are separated by a substantially constant distance due to the insulating layers 60 being interposed therebetween.

A function of the insulating layers 60 is to prevent metallic diffusion of the semiconductor-through-electrodes 50. The insulating layers 60 are formed with enough thickness to prevent the diffusion of metal from the semiconductor-through-electrodes 50 toward the semiconductor substrate 10. This prevents the semiconductor substrate 10 from being silicided due to metallic diffusion of the semiconductor-through-electrodes 50. The insulating layers 60 are formed using etching or another process performed from the front face 10a side of the semiconductor substrate 10.

The structural elements 40, the semiconductor-through-electrodes 50, and the insulating layers 60 described above are formed over a range in a plane direction of the semiconductor substrate 10 (effective visual field) that is able to be captured in a photomicrograph. Specifically, for example, in a range from of 20 µm to 40 µm square. The structural elements 40 and the semiconductor-through-electrodes 50 are formed with a predetermined positional relationship with respect to the structural elements 40. For the semiconductor-through-electrodes 50 and the insulating layers 60, error from the standard of a standard predetermined positional relationship is from ten-odd nm to tens of nm.

On the other hand, the structural elements 40 and the insulating layers 60 are also formed with a predetermined positional relationship. For the structural elements 40 and the insulating layers 60, error from the standard predetermined positional relationship is no more than several nm.

In a substrate plane direction of the semiconductor substrate 10, a distance d from inside faces of the hard-mask-through-parts 51 to inside faces of the insulating layers 60 surrounding the semiconductor-through-electrodes 50 is in a range from 600 nm to 1000 nm. More preferably, the distance d is in a range from 700 nm to 900 nm. Still more preferably, the distance d is in a range from 750 nm to 850 nm.

Next, an example of a method of manufacturing the semiconductor device 100 will be described with reference to FIGS. 2 to 6, 9, and 13 to 15. Note that these figures depict the semiconductor device 100 in cross-section.

First, a semiconductor substrate 10 is prepared, and insulating layers 60 having shapes encircling fixed regions of the semiconductor substrate 10 are formed.

Figure 2:
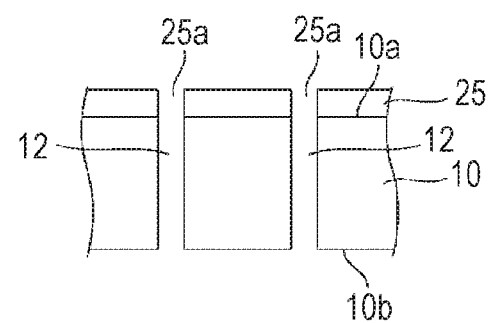
FIG. 2 is a diagram for explaining a method of manufacturing the semiconductor device according to the first exemplary embodiment.

Specifically, first, through-holes 12 of a depth passing from the front face 10a to the back face 10b of the semiconductor substrate 10 are formed in shapes encircling the fixed regions of the semiconductor substrate 10 (FIG. 2). A non-illustrated support substrate is bonded to the back face 10b side of the semiconductor substrate 10, if necessary.

The through-holes 12 are formed by digging out the semiconductor substrate 10 using anisotropic etching in which a hard mask layer 25 is used as a mask. Openings 25a are formed in the hard mask layer 25. The openings 25a encircle the fixed regions of the semiconductor substrate 10 in line shapes running across the front face 10a of the semiconductor substrate 10. A hard mask layer 25 having such openings 25a is formed as follows.

First, a hard mask layer of $SiO_2$, SiN, or the like is formed over the entire front face 10a of the semiconductor substrate 10, and a resist mask having openings at positions for openings 25a in the hard mask layer 25 is formed on the hard mask layer using a photolithographic technique. The openings 25a are formed using dry etching that employs this resist mask on the hard mask layer. Note that the resist mask is removed after dry etching.

Figure 3:
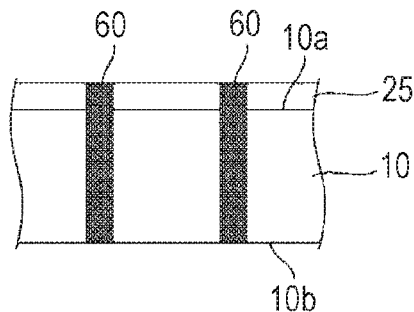
FIG. 3 is a diagram for explaining a method of manufacturing the semiconductor device according to the first exemplary embodiment.
Figure 4:
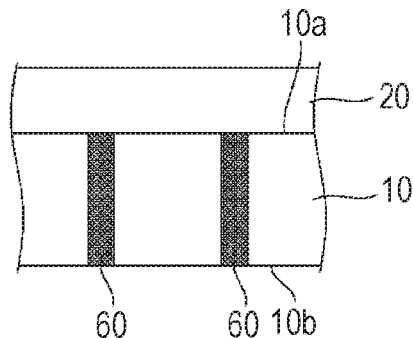
FIG. 4 is a diagram for explaining a method of manufacturing the semiconductor device according to the first exemplary embodiment.

Then, insulating layers 60 having shapes encircling the fixed regions of the semiconductor substrate 10 are formed by filling an insulating material into the through-holes 12 formed in the semiconductor substrate 10 (FIG. 3). Examples of the insulating material include at least one of SiN, SiO, a combination of SiN and polysilicon, and so on.

Various methods by which the insulating material is able to be filled into the through-holes 12, such as plasma chemical vapor deposition (CVD) or spin coating, may be employed as the method of filling the insulating material.

Note that insulating material laminated on the hard mask layer 25 is removed by chemical mechanical polishing (CMP) or another kind of polishing/grinding. In a case where the semiconductor substrate 10 is subsequently thinned by polishing/grinding or the like from the back face 10*b* side of the semiconductor substrate 10, the depth of the insulating layers 60 (depth of the through-holes 12) is preferably at least equal to the thickness of the semiconductor substrate 10 post-thinning.

Thereafter, a step is performed whereby, for example, transistors are formed on the front face 10*a* of the semiconductor substrate 10 and the interconnection layer 20 is lamination-formed on the front face 10*a* of the semiconductor substrate 10 (FIG. 4), and if necessary, a step is performed whereby another separately prepared semiconductor substrate is joined to the top the interconnection layer 20 so as to form a unit. Hereafter, mention of the hard mask layer 25 and the insulating layers 60 in the openings 25*a* in the hard mask layer 25 will be as part of the interconnection layer 20.

Figure 5:
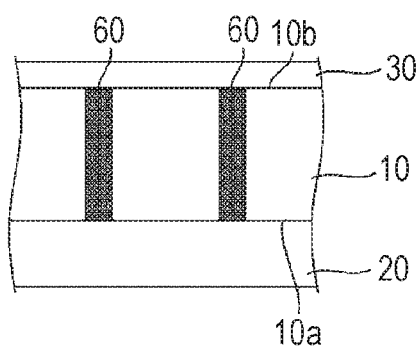
FIG. 5 is a diagram for explaining a method of manufacturing the semiconductor device according to the first exemplary embodiment.

Next, the semiconductor substrate 10 is inverted such that the back face 10*b* faces upward, and a protective layer 30 of SiO$_2$, SiN, or the like is formed over the entire back face 10*b* of the semiconductor substrate 10 (FIG. 5). The protective layer 30 will be subsequently used as a hard mask.

Figure 6:
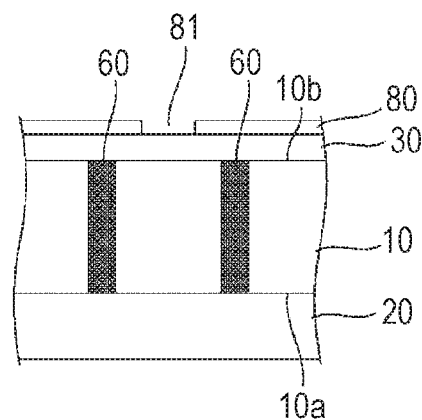
FIG. 6 is a diagram for explaining a method of manufacturing the semiconductor device according to the first exemplary embodiment.

Next, a resist mask 80 having openings 81 at positions aligned with the positions of hard-mask-through-parts 51 of semiconductor-through-electrodes 50 in the plane direction of the semiconductor substrate 10 is formed over the protective layer 30 using a photolithographic technique (FIG. 6).

Next, an inspection (opening position inspection) is performed as to whether the openings 81 are formed at appropriate positions in the resist mask 80.

In the opening position inspection, first, an image of the back face 10*b* side of the semiconductor substrate 10 formed with the resist mask 80 is captured through an optical microscope such that the positions where the openings 81, the insulating layers 60, and the structural elements 40 are formed are included within the capture range of the optical microscope. The capture range is, for example, set in a 20 μm to 40 μm square range. Put another way, the positions where the insulating layers 60 and the structural elements 40 are formed are adjusted in advance so as to fit within the range of capturing performed in this step.

Next, image processing is performed on the captured image (hereafter referred to as verification image P0 (not illustrated in the drawings)), and the positions of an opening 81 and a structural element 40 in the verification image P0 are identified.

Figure 7:
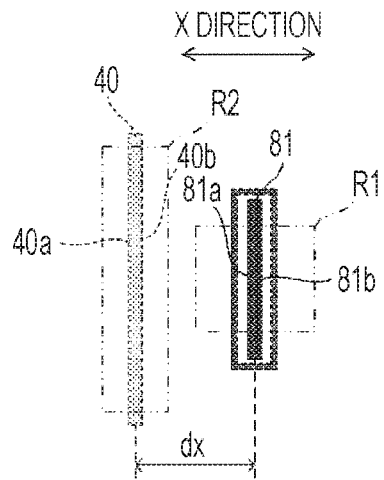
FIG. 7 is a diagram for explaining a method of identifying positions of an opening and a structural element from a verification image.

FIG. 7 is a diagram for explaining a method of identifying the positions of the opening 81 and the structural element 40 in the verification image P0. As illustrated in this figure, the verification image P0 is set with a first area R1 for identifying the position of the opening 81, and with a second area R2 for identifying the position of the structural element 40.

At least part of the opening 81 is included in the area of the first area R1. The first area R1 is set with a range so as to include both edges 81*a*, 81*b* of the opening 81 that run perpendicular to a direction running along the X direction illustrated in FIG. 7. At least part of the structural element 40 is included in the area of the second area R2. The second area R2 is set with a range so as to include both edges 40*a*, 40*b* of the structural element 40 that run perpendicular to a direction running along the X direction illustrated in FIG. 7.

Then, image processing employing image brightness waveforms to identify an X direction centroid is respectively performed on an image (hereafter referred to as partial image P1 (not illustrated in the drawings)) included in the first area R1 and on an image (hereafter referred to as partial image P2) included in the second area R2.

Figure 8:
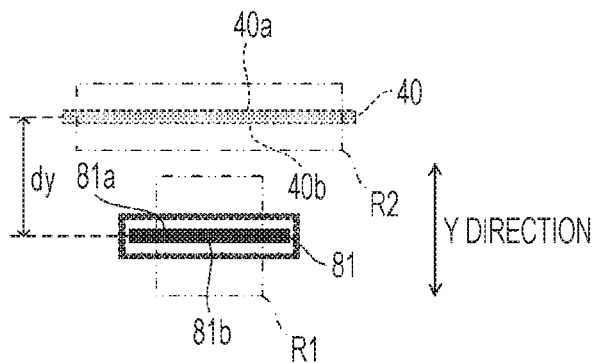
FIG. 8 is a diagram for explaining a method of identifying positions of an opening and a structural element from a verification image.

The centroid positions for the opening 81 and structural element 40 identified in this manner are utilized to identify a separation distance dx between the opening 81 and the structural element 40 in the X direction, and a difference difx (not illustrated in the drawings) between the separation distance dx and an ideal separation distance dx0 (not illustrated in the drawings) between the opening 81 and the structural element 40 in the X direction is determined. Furthermore, similarly, as illustrated in FIG. 8, centroid positions are identified for a different opening 81 and structural element 40 combination, a separation distance dy between this opening 81 and this structural element 40 is identified, and a difference dify (not illustrated in the drawings) between the separation distance dy and an ideal separation distance dy0 (not illustrated in the drawings) between this opening 81 and this structural element 40 is determined.

A state in which these differences difx, dify are within a range of allowable error is a state in which the structural elements 40 and semiconductor-through-electrodes 50 have the predetermined positional relationship. In a case where the differences difx, dify are within the range of allowable error, openings 31 that pass through the protective layer 30 are formed using dry etching that employs the resist mask 80 formed in the step described above (FIG. 9).

Figure 9:
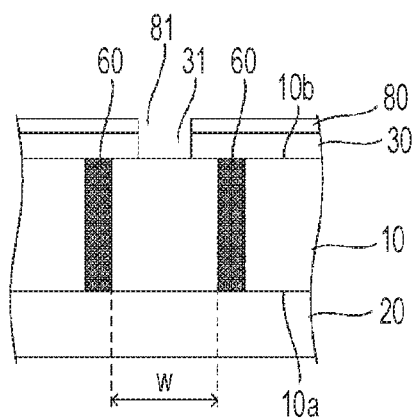
FIG. 9 is a diagram for explaining a method of manufacturing the semiconductor device according to the first exemplary embodiment.

However, in a case where the differences difx, dify exceed the range of allowable error, the resist mask 80 formed in the step described above is momentarily removed, the resist mask 80 is re-formed with the openings 81 at positions such that the differences difx, dify are within the range of allowable error, and openings 31 that pass through the protective layer 30 are formed using dry etching that employs the re-formed resist mask (FIG. 9).

As a result of the above steps, the protective layer 30, serving as a hard mask, is able to be formed with the openings 31 formed such that the relative positions of the openings 31 with respect to the structural elements 40 are controlled with high precision.

Here, in the method described above, when positional relationships with respect to the structural elements 40 are adjusted, that the insulating layers 60 are formed at positions surrounding the vicinity of the openings 81 may become an issue. In other words, insulating layers 60 visible through the protective layer 30 also appear in the verification image P0, and since the setting precision of the first area R1 is on the order of tens of nm to hundreds of nm, it is difficult to set the range of the first area R1 while excluding the insulating layers 60 appearing in the verification image P0, and the insulating layers 60 will appear in the partial image P1 at both sides of the opening 81 of the resist mask 80. Then, because insulating layers 60 appear in the partial image P1, there is a possibility that the centroid position for the opening 81 will change.

Figure 10:
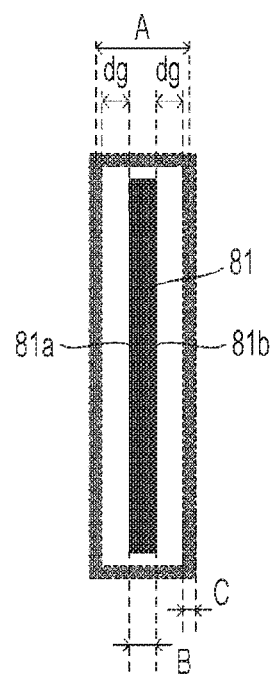
FIG. 10 is a diagram for explaining an insulating layer inside width A, an opening width B, and an insulating layer width C.

Description follows regarding shapes/structures for the above-described openings 81 and insulating layers 60 with which, in detecting centroid positions for the openings 81, even supposing a case where the insulating layers 60 were to appear, there is not liable to be an effect on the centroid positions for the openings 81. In the following description, as illustrated in FIG. 10, an insulating layer inside width is denoted A (nm), the width of an opening 81 is denoted B (nm), and the width of the insulating layer 60 is denoted C (nm).

Figure 11:
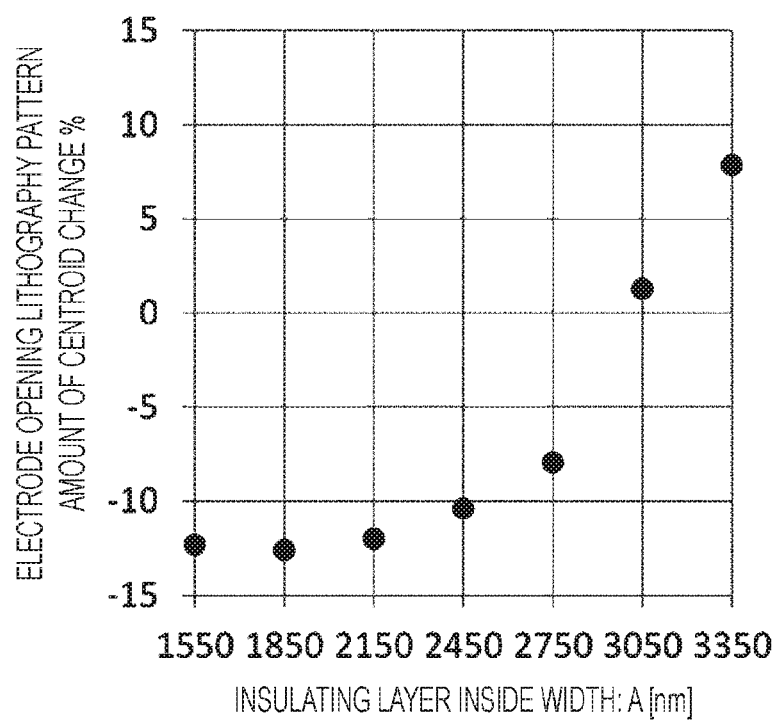
FIG. 11 is a graph of amounts of centroid change that have been measured while varying insulating layer inside width A.

FIG. 11 is a graph of amounts of centroid change that have been measured while varying insulating layer inside width A, for an insulating layer 60 width C of 150 nm and an opening 81 width B of 1600 nm. The amount of centroid change (=[an amount of shift occurring due to appearance]/ [an amount of positional offset with respect to the insulating layer through-hole electrode step]) is a rate of influence of the positional offset of the insulating layer 60 appearance. In other words, this means that in a case where an insulating layer 60 appearance is offset 50 nm with respect to an opening 81, for an amount of centroid change of 10%, a 5 nm centroid offset will occur.

Figure 12:
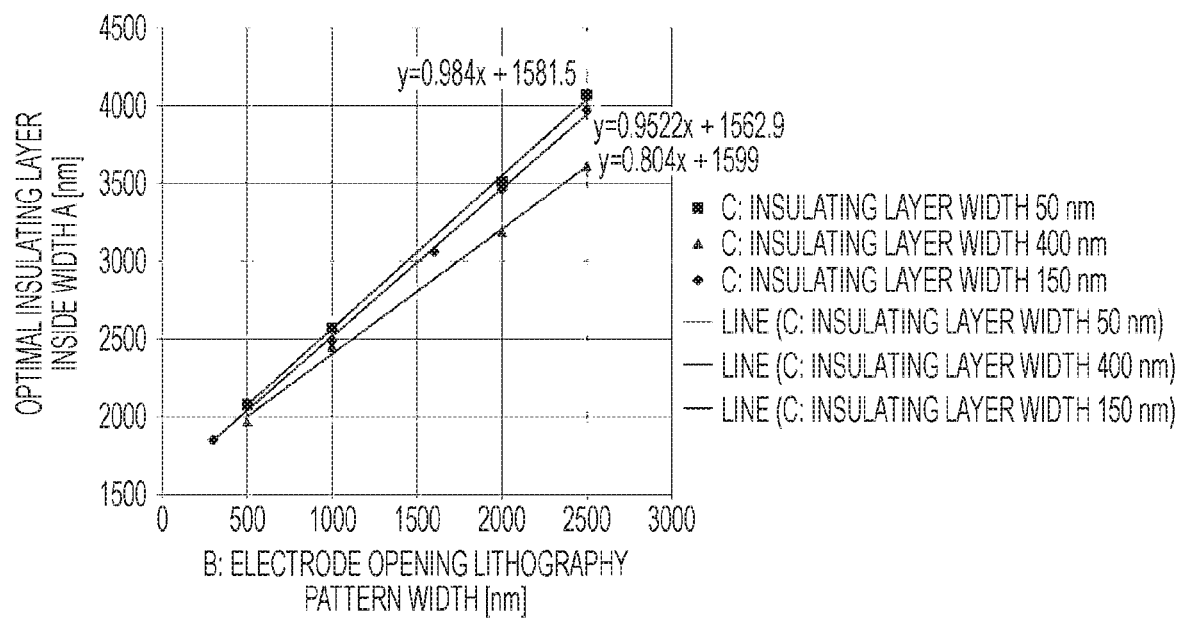
FIG. 12 is a graph of ideal insulating layer inside width A values at which the amount of centroid change mentioned above is suppressed to substantially zero, measured while modifying opening width B, for a plurality of insulating layer widths C.

FIG. 12 is a graph of ideal insulating layer inside width A values at which the amount of centroid change described above is suppressed to substantially zero, measured while modifying opening 81 width B, for a plurality of insulating layer 60 widths C. As illustrated in this figure, with regards to the plurality of widths C, it is apparent that for insulating layer inside widths A, the ideal insulating layer inside width A changes with a slope of nearly 1 with respect to widths B.

It is apparent from FIG. 12 that the intercept for each series is roughly 1.6 μm. With this arrangement, it is apparent that in a case where a respective distance dg between each of the edges 81a, 81b of the opening 81 and an inside edge of the insulating layer 60 is approximately 800 nm, centroid changes are least likely to occur. In addition, it is apparent that if the distance dg is from 600 nm to 1000 nm, the rate of centroid change is suppressed to within approximately 5%, if the distance dg is from 700 nm to 900 nm, the rate of centroid change is suppressed to within approximately 2.5%, and if the distance dg is from 750 nm to 850 nm, the rate of centroid change is suppressed to within approximately 1.25%.

Next, through-holes 13 that pass through the semiconductor substrate 10 are formed using dry etching with the protective layer 30 serving as a hard mask. However, as illustrated in FIG. 9, the openings 31 are provided to the inside of the insulating layers 60, and a size w of the inside of the insulating layers 60 is smaller than the openings 31.

Figure 13:
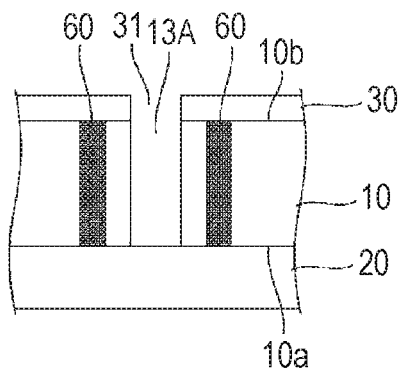
FIG. 13 is a diagram for explaining a method of manufacturing the semiconductor device according to the first exemplary embodiment.
Figure 14:
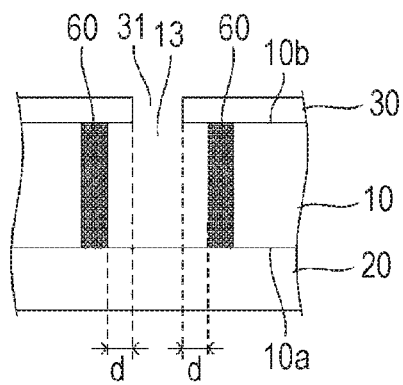
FIG. 14 is a diagram for explaining a method of manufacturing the semiconductor device according to the first exemplary embodiment.

Thus, first, through-holes 13A that pass through the semiconductor substrate 10 are formed using anisotropic dry etching with the protective layer 30 serving as a hard mask (FIG. 13). The through-holes 13A are formed substantially the same size as the openings 31. Thereafter, the semiconductor substrate 10 remaining between the through-holes 13A and the insulating layers 60 is removed by isotropic dry etching, and the through-holes 13, the inside of which the inside walls of the insulating layers 60 are completely exposed, are formed (FIG. 14).

In this manner, no semiconductor substrate 10 remains between the insides of the insulating layers 60 and the semiconductor-through-electrodes 50 that are formed in the through-holes 13 in a subsequent step. This enables siliciding of the semiconductor-through-electrodes 50 and remaining semiconductor substrate 10 in regions encircled by the insulating layers 60 to be prevented.

Note that there is a limit to the size of the semiconductor substrate 10 able to be removed by side etching with isotropic dry etching. This limit is due to an upper bound for plasma penetration length, and is, for example, on the order of hundreds of nm. Therefore, a gap (distance d) between the openings 31 and the insulating layers 60 is set to be less than or equal to the upper bound for plasma penetration length.

Figure 15:
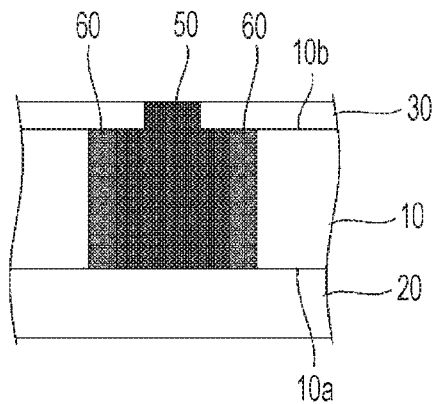
FIG. 15 is a diagram for explaining a method of manufacturing the semiconductor device according to the first exemplary embodiment.

Next, conductive layers for the semiconductor-through-electrodes 50 are filled into the through-holes 13 (FIG. 15). A seed metal layer having a thickness on the order of 10 nm to 35 nm and configured from, for example, a laminated film of tantalum and copper, Ti, Cu, TiW/Cu, or the like, is adhered and formed on bottom faces and inside faces of the through-holes 13. Then, Cu is filled to the inside of the seed metal layer by Cu electroplating. For semiconductor-through-electrodes 50 formed in this manner, the insulating layers 60 are formed between the Cu and the semiconductor substrate 10, there is no Cu diffusion into the semiconductor substrate 10, and siliciding of the semiconductor substrate 10 is able to be prevented.

Thereafter, a protective layer 70 configured from an oxide film (SiO), a nitride film (SiN), or another insulating material is formed over the protective layer 30 so as to cover the entire protective layer 30 and the semiconductor-through-electrodes 50 exposed from the openings 31. The semiconductor device 100 according to the present exemplary embodiment is able to be manufactured using the above manufacturing method.

(B) Second Exemplary Embodiment

Figure 16A:
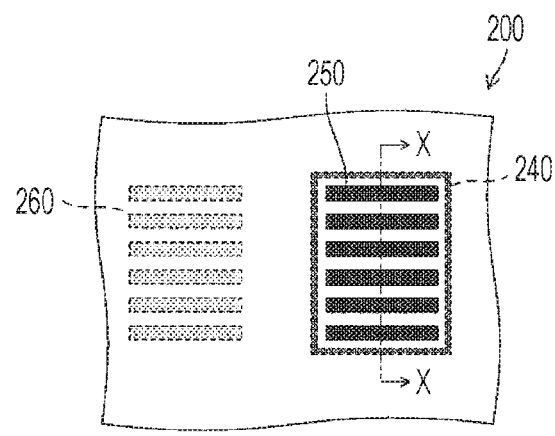
FIGS. 16A and 16B are diagrams illustrating relevant parts of a semiconductor device according to a second exemplary embodiment.
Figure 16B:
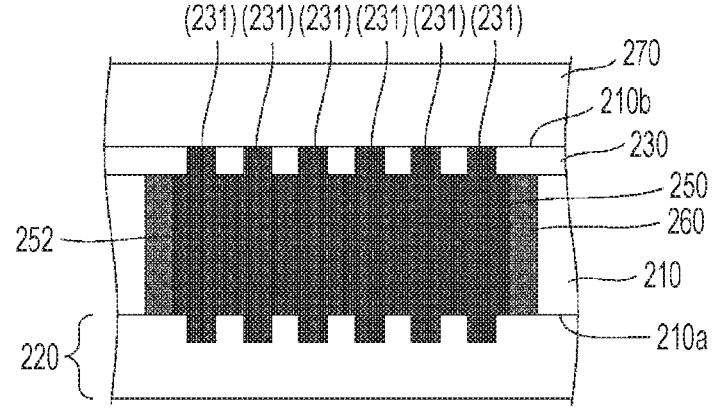

FIGS. 16A and 16B a are diagrams illustrating relevant parts of a semiconductor device 200 according to the present exemplary embodiment. FIG. 16A is diagram illustrating relevant parts of the semiconductor device 200 as seen in plan view. FIG. 16B is a diagram illustrating relevant parts of the semiconductor device 200 as seen in a cross-sectional view along line X-X illustrated in FIG. 16A. Note that FIG. 16A is a diagram in which the semiconductor device 200 is seen from a back face 210b side of a semiconductor substrate 210, in a state with no protective layer 270.

The semiconductor device 200 is provided with the semiconductor substrate 210, an interconnection layer 220, a protective layer 230, structural elements 240, semiconductor-through-electrodes 250, insulating layers 260, and the protective layer 270.

Note that the semiconductor device 200 is configured similarly to the semiconductor device 100 described above, except for with regards to the shapes of the semiconductor-through-electrodes 250 and the structural elements 240 and the shape of other configuration modified in accordance with these shapes. Accordingly, corresponding reference numerals will be given to configuration shared with the semiconductor device 100 (reference numerals for configuration of the semiconductor device 100 will be prepended with "2"), and detailed explanation thereof will be omitted.

The semiconductor-through-electrodes 250 are similar to those in the first exemplary embodiment in that the semiconductor-through-electrodes 250 are formed passing between the back face 210b and a front face 210a of the semiconductor substrate 210, but differ in that a plurality of hard-mask-through-parts 251 is provided passing through the protective layer 230 (openings 231 formed in the protective layer 230) in the ranges surrounded by the insulating layers 60.

In other words, semiconductor-through-bodies 252 that pass through the semiconductor substrate 210 are formed as a unit similarly to in the first exemplary embodiment, and a plurality of hard-mask-through-parts 251 is provided passing through the protective layer 230 in shapes that protrude from the semiconductor-through-bodies 252.

In the example illustrated in FIGS. 16A and 16B, the plurality of structural elements 240 is also formed in a similar shape to the openings 231 at positions differing from that of the insulating layers 260. Note that it is not necessary for the structural elements 240 to have a similar shape to the openings 231, and, for example, the structural elements 240 may have a similar structure to that of the structural elements 40 of the semiconductor device 100.

Since the insulating layers 260 are formed between the semiconductor-through-bodies 252 of the semiconductor-through-electrodes 250 and the semiconductor substrate 210 on the outside thereof, the plurality of hard-mask-through-parts 251 (openings 231 formed in the protective layer 230) is each surrounded by one insulating layer 260 in the plane direction of the semiconductor substrate 210.

In the case of the semiconductor device 100 of the first exemplary embodiment described above, since the gap (distance d) between the openings 31 and the insulating layers 60 is restricted to no more than the upper bound for the plasma penetration length of isotropic dry etching (several hundred nm), in a case where first area R1 is set such that the edges 81a, 81b of the resist mask 80 are within the range, it has been difficult to set appearing portions of insulating layers 60 outside of the first area R1, for which setting precision is on the order of tens of nm to hundreds of nm.

In contrast, by dividing the openings 231 in the protective layer 230 into a plurality and forming a plurality of spaces between the plurality of openings 231 as in the semiconductor device 200 according to the present exemplary embodiment, it is possible to utilize edges that face the spaces of the plurality of openings 231 in the first area R1. Moreover, since the openings 231 in a resist mask 280 are formed in the same device as the device that performs the step of measuring the position of the openings 231, the positions of the openings 231 are able to be identified with high precision. Accordingly, the first area R1 is able to be set such that positions of insulating layer 260 appearances are not within the range thereof.

Note that the method of manufacturing the semiconductor device 200 is substantially similar to the method of manufacturing the semiconductor device 100 described above. However, the width of the spaces of the plurally formed openings 231 is set to no more than twice the upper bound for the plasma penetration length of isotropic dry etching (several hundred nm). This enables the complete removal of semiconductor substrate 210 in the regions encircled by the insulating layers 60 using isotropic dry etching performed through the plurality of openings 231. Furthermore, in the method of manufacturing the semiconductor device 200 according to the present exemplary embodiment, there is no need to adopt shapes/structures for the openings 281 and the insulating layers 260 with which centroid position detection for the openings 281 is less liable to change due to the appearance of insulating layers 260.

Figure 17A:
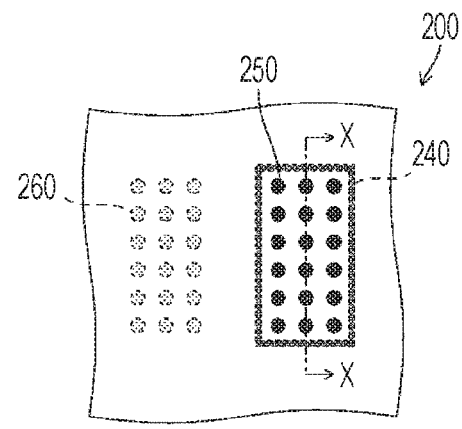
FIGS. 17A and 17B are diagrams illustrating another example of relevant parts of the semiconductor device according to the first exemplary embodiment.
Figure 17B:
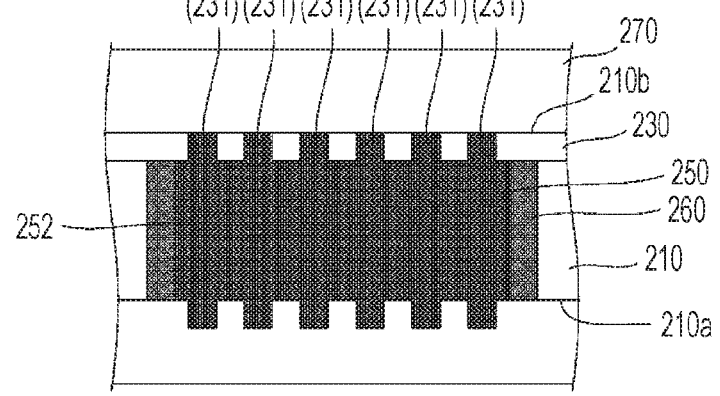

Furthermore, it is not necessary for the shapes of the plurality of openings 231 formed in the range surrounded by the insulating layers 260 to be rectangular, and for example, these may be circular as illustrated in FIGS. 17A and 17B. Various modifications to the shape and arrangement of the openings 231 are possible so long as restrictions due to plasma penetration length in isotropic dry etching are met.

(C) Third Exemplary Embodiment

FIGS. 18A and 18B are diagrams illustrating relevant parts of a semiconductor device 300 according to the present exemplary embodiment. FIG. 18A is diagram illustrating relevant parts of the semiconductor device 300 as seen in plan view. FIG. 18B is a diagram illustrating relevant parts of the semiconductor device 300 as seen in a cross-sectional view along line X-X illustrated in FIG. 18A. Note that FIG. 18A is a diagram in which the semiconductor device 300 is seen from a back face 310b side of a semiconductor substrate 310, in a state with no protective layer 370.

The semiconductor device 300 is provided with the semiconductor substrate 310, an interconnection layer 320, a protective layer 330, structural elements 340, semiconductor-through-electrodes 350, insulating layers 360, and the protective layer 370.

Note that the semiconductor device 300 is configured similarly to the semiconductor device 100 described above, except for with regards to the shapes of the semiconductor-through-electrodes 250 and the insulating layers 360 and the shape of other configuration modified in accordance with these shapes, in that the semiconductor device 300 is not provided with configuration corresponding to the protective layer 30, and with regards to the method of manufacturing the semiconductor-through-electrodes 250 and the insulating layers 360.

Accordingly, corresponding reference numerals will be given to configuration shared with the semiconductor device 100 (reference numerals for configuration of the semiconductor device 100 will be prepended with "3"), and detailed explanation thereof will be omitted.

In the semiconductor-through-electrodes 350 according to the present exemplary embodiment, hard-mask-through-parts 351 that are locations passing through the protective layer 330 have substantially the same width as semiconductor-through-bodies 352 formed in the semiconductor substrate 310. In other words, the semiconductor-through-electrodes 350 have a continuously formed profile at the boundary of the semiconductor substrate 310 and the protective layer 330.

As for the method of manufacturing the semiconductor device 300, first, from the side of a front face 310a of the semiconductor substrate 310, by a method similar to that for the insulating layers 60, insulating layers 360A are formed over the entireties of the fixed regions of the semiconductor substrate 310 (FIG. 19). The width d of the insulating layers 360A is preferably less than or equal to 1000 nm. Making the width d of the insulating layer 360A a narrow width suppresses the possibility of void formation in the insulating layers 360A, and allows the time to form the insulating layers 360A in a manufacturing step by the filling of an insulating material to be kept within a reasonable range for the manufacturing step.

Then, after forming the interconnection layer 320 and the like, a resist mask 380 is formed directly on the back face 310b side of the semiconductor substrate 310 without forming configuration equivalent to the protective layer 30. Openings 381 having the same shape as the semiconductor-through-electrodes 350 are formed in the resist mask 380. With respect to the openings 381 formed in this manner, similarly to in the case of the openings 81 described above, the centroids for openings 381 and the centroids for structural elements 340 are measured, and in a case where there is positional offset, a resist mask 380 that corrects for the amount of change is re-formed.

Similarly to the openings 81 in the resist mask 80 in the first exemplary embodiment described above, there is a possibility that the centroid position for the openings 381 in the resist mask 380 will change due to insulating layers 360A appearing in a partial image P1.

Figure 20:
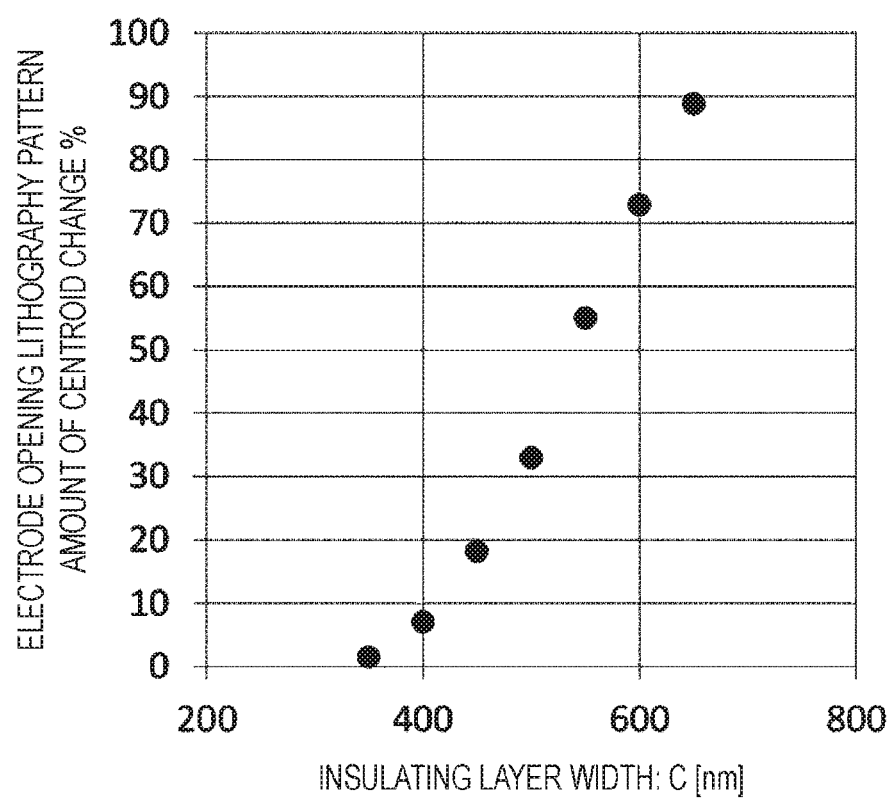
FIG. 20 is a graph illustrating a relationship between insulating layer width C and a rate of centroid change for an opening.

FIG. 20 is a graph illustrating a relationship between the insulating layer 360A width C and a rate of centroid change for an opening 381. In the example illustrated in this figure, a simulation has been performed in which the width of an opening 381 has been set to 300 nm. As illustrated in this figure, it is apparent that as the width C of the insulating layer 360A becomes narrower (approaches the width of the openings 381), the rate of centroid change decreases.

More specifically, it is apparent that when the width C of the insulating layer 360A is, for example, set to 350 nm, the rate of centroid change is nearly 0, that when the width C is set to a range from, for example, 350 nm to 380 nm, the rate of centroid change is able to be suppressed to less than or equal to 5%, and that when the width C is set to a range from, for example, 350 nm to 420 nm, the rate of centroid change is able to be suppressed to less than or equal to 10%.

Thereafter, through-holes 313 are formed in the insulating layers 360A by dry etching the insulating layers 360A using the resist mask 380 as an etching mask. The insulating layers 360A formed with the through-holes 313 are equivalent to the insulating layer 360 described above. The semiconductor-through-electrodes 350 are formed by filling a conductive material into the through-holes 313.

In this manner, in the present exemplary embodiment, insulating layers 360A that have been formed comparatively wide are etched, and remaining portions of the insulating layers 360A that have been scooped out configure the insulating layers 360. For this reason, compared with insulating layers 60 formed by depositing an insulating material into a fixed-width groove formed by etching, the thickness of the insulating layers 360 is uneven, and the thickness of the insulating layers 360 between the semiconductor substrate 310 and the semiconductor-through-electrodes 350 is uneven.

As described above, the insulating layers 360A may be etched to form through-holes for forming the semiconductor-through-electrodes 350, and in this case, the width of the semiconductor-through-electrodes 350 is able to be made thinner.

In this case, a necessary width for insulating layers 360 that remain after etching is computed by Equation (1) below. Note that in Equation (1) below, $D_0$ that is (m$^2$/s) is the diffusion constant of a diffusing substance (metal configuring the semiconductor-through-electrodes 350) in the insulating material that formed the insulating layer 360, Q (J/mol) is likewise the activation energy of the diffusing substance, T (K) is the temperature during annealing performed in a step subsequent to forming the insulating layers 360, t (s) is likewise the annealing time, L (m) is likewise the diffusion length of the diffusing substance, and R is the gas constant (8.31446·(J/(mol·K)).

[Equation 1]

$$L = \sqrt{2 \times t \times D_0 \times \exp\left(\frac{-Q}{RT}\right)} \quad (1)$$

Specifically, for example, if the insulating layer material is SiN, the electrode material of the semiconductor-through-electrodes 350 is Cu, the annealing temperature is 400° C., and the annealing time is 15 minutes, the diffusion length L of the substance is about 65 nm, and the necessary width for the direct performance 360 is determined to be at least 65 nm.

Note that the present technology is not limited to the exemplary embodiments described above, and the present technology includes configurations in which configurations disclosed in the above embodiments are substituted with one another or combinations thereof are modified, and configurations in which known technology and configurations disclosed in the above embodiments are substituted with one another or combinations thereof are modified. Further, the technical scope of the present technology is not limited to the exemplary embodiments described above, and encompasses matter described in the scope of claims and equivalents thereof.

Further, the present technology can take the following configurations.

(1)

A semiconductor device including:

a semiconductor substrate;

an interconnection layer that is formed on a first face of the semiconductor substrate;

at least one of a structural element that is formed to the interconnection layer, or a structural element that is formed in the semiconductor substrate from a first face side of the semiconductor substrate;

a semiconductor-through-electrode that is positioned and formed, from a second face side of the semiconductor substrate opposite to the first face, so as to have a predetermined positional relationship with respect to the structural element; and a metallic-diffusion-preventing insulating layer that is formed from the first face side of the semiconductor substrate in a position, and with a shape, surrounding the semiconductor-through-electrode in the semiconductor substrate.

(2)

The semiconductor device according to (1), in which the semiconductor-through-electrode is electrically disconnected from a functional part that implements circuit functionality of the semiconductor device.

(3)

The semiconductor device according to (1), in which the structural element, the semiconductor-through-electrode, and the insulating layer are formed in a 20 μm to 40 μm square range in a plane direction of the semiconductor substrate.

(4)

The semiconductor device according any one of (1) to (3), in which the semiconductor-through-electrode is formed passing through a hard mask provided along a face of the semiconductor substrate on an opposite side of the semiconductor substrate to the interconnection layer; and a hard-mask-penetrating part of the semiconductor-through-electrode has a narrower width than the semiconductor-through-electrode formed in the semiconductor substrate.

(5)

The semiconductor device according to any one of (1) to (4), in which the semiconductor-through-electrode is formed passing through a hard mask provided along a face of the semiconductor substrate on the opposite side of the semiconductor substrate to the interconnection layer; and a plurality of hard-mask-through-parts of the semiconductor-through-electrode is formed in a formation region of the insulating layer.

(6)

The semiconductor device according to any one of (1) to (3), in which the semiconductor-through-electrode is formed passing through a hard mask provided along a face of the semiconductor substrate on an opposite side of the semiconductor substrate to the interconnection layer; and a hard-mask-penetrating part of the semiconductor-through-electrode has substantially the same shape as the semiconductor-through-electrode formed in the semiconductor substrate.

(7)

The semiconductor device according to (6), in which in a substrate plane direction of the semiconductor substrate, a distance from an inside face of the hard-mask-penetrating part to an inside face of the insulating layer surrounding the semiconductor-through-electrode is in a range from 600 nm to 1000 nm.

(8)

The semiconductor device according to any one of (1) to (5), in which a thickness of the insulating layer between the semiconductor substrate and the semiconductor-through-electrode is a substantially constant thickness.

(9)

The semiconductor device according to any one of (1) to (3) and (7), in which a thickness of the insulating layer between the semiconductor substrate and the semiconductor-through-electrode is uneven.

(10)

A semiconductor device manufacturing method including:

a step of lamination-forming an interconnection layer on one side face of a semiconductor substrate;

a step of forming a structural element in the semiconductor substrate;

a step of forming a metallic-diffusion-preventing insulating layer that passes between front and back sides of the semiconductor substrate, in a shape that encircles a fixed region of the semiconductor substrate not including the structural element;

a step of forming a hard mask along another side face of the semiconductor substrate;

a step of forming a resist having an opening inside the fixed region on the hard mask;

a step of verifying, on the basis of an image captured from the resist side, whether or not the opening is formed with a predetermined positional relationship with respect to the structural element;

a step of removing the resist, and re-forming, on the basis of the image, a resist provided with an opening with the predetermined positional relationship with respect to the structural element, in a case where it has been verified that the opening is not formed with the predetermined positional relationship with respect to the structural element; and a step of forming a semiconductor-through-electrode by, using the resist as an etching mask, forming a through-hole that passes through to the interconnection layer, and embedding metal in the through-hole.

REFERENCE SIGNS LIST

10 Semiconductor substrate
10a Front face
10b Back face
12 Through-hole
13 Through-hole
13A Through-hole
20 Interconnection layer
25 Hard mask layer
25a Opening
30 Protective layer
31 Opening
40 Structural element
40a Edge
40b Edge
50 Semiconductor-through-electrode
51 Hard-mask-through-part
52 Semiconductor-through-body
60 Insulating layer
70 Protective layer
80 Resist mask
81 Opening
81a Edge
81b Edge
100 Semiconductor device
200 Semiconductor device
210 Semiconductor substrate
210a Front face
210b Back face
220 Interconnection layer
230 Protective layer
231 Opening
240 Structural element
250 Semiconductor-through-electrode
251 Hard-mask-through-part
252 Semiconductor-through-body
260 Insulating layer
270 Protective layer
280 Resist mask
281 Opening
300 Semiconductor device
310 Semiconductor substrate
310a Front face
310b Back face
313 Through-hole
320 Interconnection layer
330 Protective layer
340 Structural element
350 Semiconductor-through-electrode
351 Hard-mask-through-part
352 Semiconductor-through-body
360 Insulating layer
360A Insulating layer
370 Protective layer
380 Resist mask
381 Opening
R1 First area
R2 Second area

The invention claimed is:

1. A semiconductor device, comprising:
a semiconductor substrate;
an interconnection layer on a first face side of the semiconductor substrate;
a structural element, wherein the structural element is within at least one of the interconnection layer or the first face side of the semiconductor substrate;
a semiconductor-through-electrode between a second face side of the semiconductor substrate and the first face side of the semiconductor substrate, wherein
the semiconductor-through-electrode includes at least one hard-mask-penetrating part,
the second face side is opposite to the first face side, and
the semiconductor-through-electrode has a specific positional relationship with respect to the structural element;
a first hard mask on the second face side of the semiconductor substrate, wherein
the first hard mask includes at least one opening portion, and each hard-mask-penetrating part of the at least one hard-mask-penetrating part is exposed from a respective opening portion of the at least one opening portion;
a second hard mask that covers
an entire surface of the first hard mask, and
an entire surface of a portion of each hard-mask-penetrating part exposed from the respective opening portion of the at least one opening portion in the first hard mask, wherein the second hard mask includes an insulating material; and
a metallic-diffusion-preventing insulating layer on the first face side of the semiconductor substrate, wherein
the metallic-diffusion-preventing insulating layer is entirely within the semiconductor substrate,
a depth of the metallic-diffusion-preventing insulating layer is equal to a thickness of the semiconductor substrate, and
the metallic-diffusion-preventing insulating layer is in a position and a shape that surrounds the semiconductor-through-electrode in the semiconductor substrate.

2. The semiconductor device according to claim 1, wherein
the semiconductor-through-electrode is electrically disconnected from a functional part, and
the functional part implements circuit functionality of the semiconductor device.

3. The semiconductor device according to claim 1, wherein the structural element, the semiconductor-through-electrode, and the metallic-diffusion-preventing insulating layer are in a range of 20 μm square to 40 μm square in a plane direction of the semiconductor substrate.

4. The semiconductor device according to claim 1, wherein
the semiconductor-through-electrode passes through the first hard mask to the interconnection layer, and
a width of each hard-mask-penetrating part of the at least one hard-mask-penetrating part of the semiconductor-through-electrode is narrower than a width of the semiconductor-through-electrode in the semiconductor substrate.

5. The semiconductor device according to claim 1, wherein
the semiconductor-through-electrode passes through the first hard mask to the interconnection layer, and
each hard-mask-penetrating part of the at least one hard-mask-penetrating part of the semiconductor-through-electrode is in a formation region of the metallic-diffusion-preventing insulating layer.

6. The semiconductor device according to claim 1, wherein a thickness of the metallic-diffusion-preventing insulating layer between the semiconductor substrate and the semiconductor-through-electrode is substantially constant.

* * * * *